(12) United States Patent
Margalit

(10) Patent No.: US 9,502,344 B2
(45) Date of Patent: Nov. 22, 2016

(54) WAFER LEVEL PACKAGING OF ELECTRONIC DEVICE

(71) Applicant: VIAGAN Ltd., Zichron Yaaqov (IL)

(72) Inventor: Mordechai Margalit, Zichron Yaakov (IL)

(*) Notice: Subject to any disclaimer, the term of this patent is extended or adjusted under 35 U.S.C. 154(b) by 0 days.

(21) Appl. No.: 14/872,646

(22) Filed: Oct. 1, 2015

(65) Prior Publication Data

US 2016/0099206 A1  Apr. 7, 2016

Related U.S. Application Data

(60) Provisional application No. 62/060,196, filed on Oct. 6, 2014, provisional application No. 62/068,650, filed on Oct. 25, 2014.

(51) Int. Cl.
*H01L 23/498* (2006.01)
*H01L 21/48* (2006.01)
*H01L 21/56* (2006.01)
*H01L 23/31* (2006.01)

(52) U.S. Cl.
CPC ....... *H01L 23/49838* (2013.01); *H01L 21/481* (2013.01); *H01L 21/486* (2013.01); *H01L 21/561* (2013.01); *H01L 21/565* (2013.01); *H01L 23/3114* (2013.01); *H01L 23/3128* (2013.01); *H01L 23/49827* (2013.01); *H01L 23/49833* (2013.01); *H01L 23/49894* (2013.01); H01L 23/49816 (2013.01); H01L 2224/18 (2013.01)

(58) Field of Classification Search
CPC .......... H01L 23/49838; H01L 23/49833; H01L 23/49827; H01L 23/49894; H01L 21/486; H01L 21/565; H01L 23/3114; H01L 21/481
USPC .......................................... 257/693; 438/126
See application file for complete search history.

(56) References Cited

U.S. PATENT DOCUMENTS

| | | | |
|---|---|---|---|
| 9,257,384 B2* | 2/2016 | Park | H01L 23/49833 |
| 2013/0083503 A1* | 4/2013 | Lai | H01L 23/49827 361/783 |
| 2014/0036454 A1* | 2/2014 | Caskey | H05K 1/0298 361/735 |

* cited by examiner

*Primary Examiner* — Walter H Swanson
(74) *Attorney, Agent, or Firm* — Smith Tempel Blaha LLC; Gregory Scott Smith

(57) ABSTRACT

Wafer level packaged semiconductor device with enhanced heat dissipation properties. The semiconductor device includes a top and a bottom face and at least one metal pad is positioned on the top and the bottom faces. A top cover is affixed to the top face of the semiconductor device and a bottom cover is affixed to the bottom face of the semiconductor device. Vias extend through the top and bottom covers and an electroplated metal layer extends from an external face of the covers, through the visas to the metal pads on the semiconductor device.

8 Claims, 12 Drawing Sheets

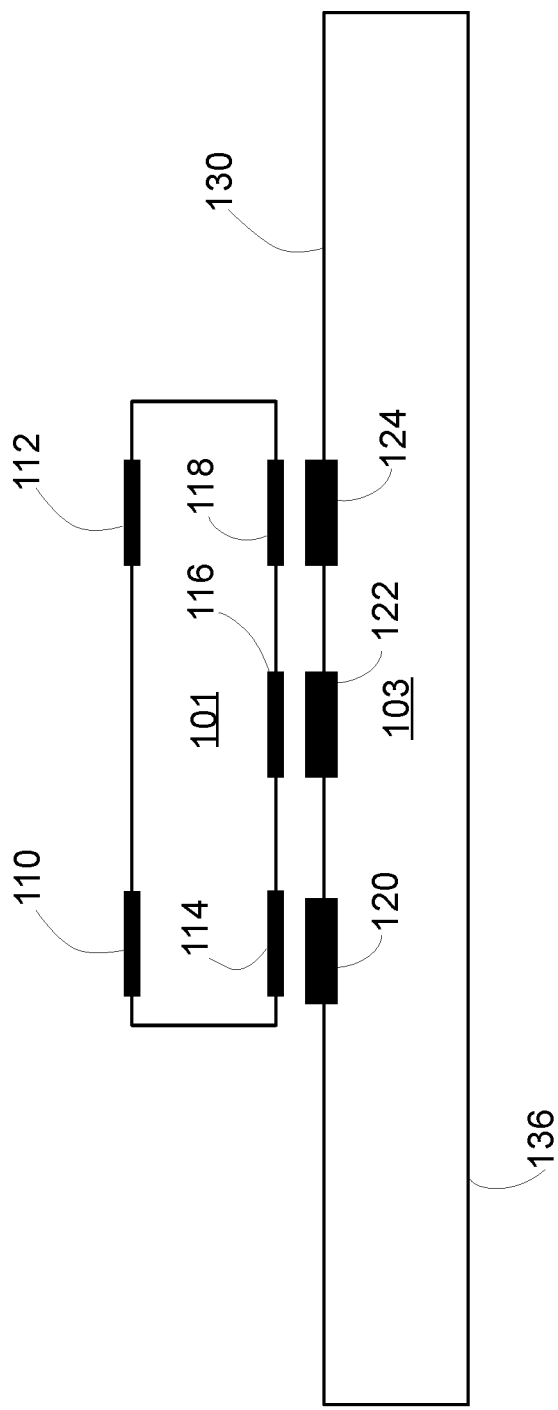

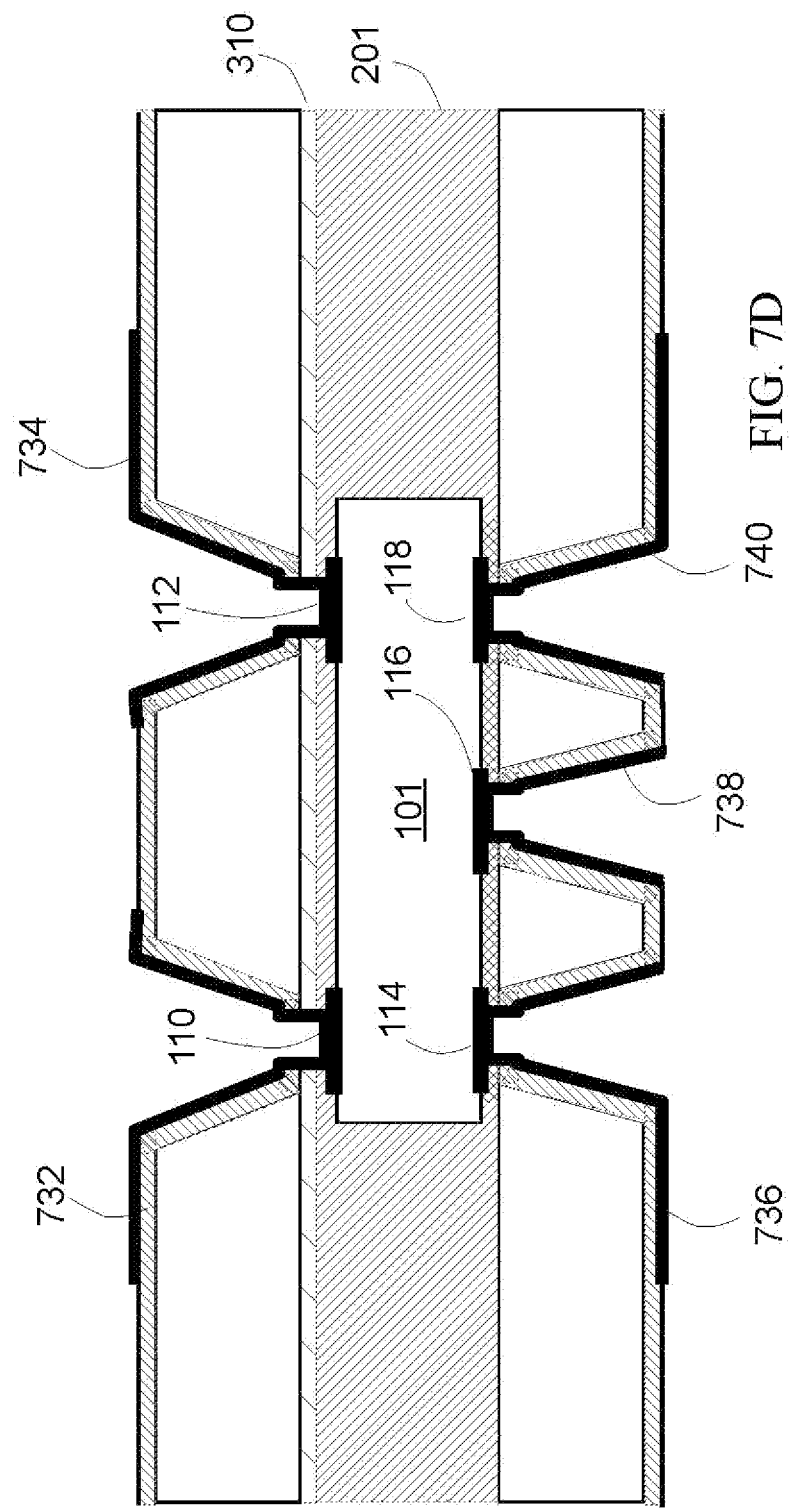

WAFER LEVEL PACKAGING OF ELECTRONIC DEVICE

TECHNOLOGY FIELD

The present method and device relate to the packaging of electronic devices while providing external physical connections to the electronic device such as electrical connections, thermal connections and optical connections.

BACKGROUND

Electronic components such as transistors, MEMs, diodes, or more complex integrated circuits are manufactured from semiconductor wafers using chemical processing techniques. Packaging of the devices is done by encapsulating the devices with protective covers while providing for physical connections between the device and the environment. Examples of physical connections include;
  Electrical connection to provide current or voltage for device operation
  Thermal connection to dissipate heat from the device
  Optical connection to extract light from devices such as light emitting diodes, or to provide light for devices such as image sensors
  To provide a physical connection to the device for measurement of external physical parameters such as pressure, temperature, humidity, acceleration, rotation, ambient light, etc.
  State of art methods to package devices include
  Connecting the device to metal lead frames and over molding with a polymer
  Connecting the device to a polymer, glass fiber or ceramic substrate and over molding with a polymer
  Chip scale packaging where the device electrical connections are extended using an overlay of deposited metal and protective polymer coating These methods suffer from high production cost, large form factor and poor dissipation of the heat generated during the operation of the device. The heat dissipation of electronic devices is a major impediment in next generation electronics. As the density of components increases, the energy density increases. To prevent component failures enhanced heat dissipation is required. Most packaging technologies provide heat dissipation from only one side of the semiconductor chip. For example, in plastic molded packages the heat dissipation is provided by a copper slug located in the bottom side of the package. Wafer level packaging also provides more solutions for packaging electronic components. In wafer level packaging, a semiconductor wafer is laminated with layers of electrically isolating material intermixed with electrically conducting paths. The electrically conducting paths are designed by choice of material and dimensions of the electrical conducting paths for connection by a surface mount technology (SMT) to a printed circuit board (PCB). The electrical isolating layers are poor conductors of heat. As a result, standard wafer level packaging does not provide for efficient heat conduction from the electronic device. Patent Cooperation Treaty publication WO/2014/064541 to the same assignee discloses a wafer level package for LED devices where the heat conduction of the package is enhanced by creating thermal vias in the package. Patent Cooperation Treaty publication WO/2014/064541 to the same assignee describes a semiconductor package which provides for heat dissipation in one direction. For other electronic devices and specifically for power electronic devices, where the amount of generated heat is very large it is desirable to maximize the heat conductance from the device to maintain a reasonable device operating temperature. One method of enhancing the heat dissipation includes providing thermal vias in more than one direction. However providing thermal vias in more than one direction and specifically providing thermal vias in more than one direction in state of art wafer level package poses a technical challenge. Hence an alternative packaging of electronic components is desired which can provide superior heat dissipation, small form factor and low cost.

Glossary

Wafer as used in the current disclosure means a semiconductor, polymer, metal, glass, quartz, or ceramic wafer used for the packaging of electronic devices. The wafer is typically round with a diameter of 150, 200, 300 or 450 mm and thickness of 200 micron to 1000 micron.

Semiconductor device as used in the current disclosure means an electronic, optoelectronic, electromechanical device or a device having an electronic connection either for operation or for readout of a physical parameter. The semiconductor device has a semiconductor constituent composed of semiconducting materials such as Silicon, GaAs, GaN, InP and is manufactured using chemical processing methods.

Die as used in the current disclosure means a single unit of a semiconductor device. The device can also include discreet components such as capacitor, resistor, or inductor.

Bottom face as used in the current disclosure means the surface of the semiconductor device which is nominally on the bottom side of the device Top face as used in the current disclosure means the surface of the semiconductor device which is nominally on the top side of the device and located opposite the bottom face Electrical pad as used in the current disclosure means a metal coated or otherwise conducting enclosed area located on the semiconductor device top or bottom face, which provides an electrical connection into the semiconductor device Thermal pad as used in the current disclosure means an enclosed area located on the top or bottom face of the semiconductor device and adjacent to a heat generating volume of the semiconductor device.

Metal pad as used in the current disclosure means an enclosed area on the semiconductor device covered with a metal layer such as Aluminum, Copper, Gold, Nickel, Titanium, Chrome, Silver or combinations thereof or other metal layers, which can be used as either a thermal pad or an electrical pad.

Conducting region as used in the current disclosure means a region conducting either thermal or electrical flow Top cover wafer as used in the current disclosure means a wafer used to cover the top face of the semiconductor device Bottom cover wafer as used in the current disclosure means a wafer used to cover the bottom face of the semiconductor device Cover wafer as used in the current disclosure means a either a top or bottom cover wafer Via as used in the current disclosure means a pass through hole from one face of a wafer to the second opposing face of the wafer.

Internal Face as used in the current disclosure means the surface of the wafer to which semiconductor devices are attached.

External face as used in the current disclosure means the surface of the wafer which is opposing the internal face

DESCRIPTION OF FIGURES

FIG. 1A shows an example of a semiconductor device attached to a portion of a wafer using a metal bonding technique;

FIG. 7D shows an example of a portion of the cover wafers with a semiconductor device attached to the cover wafers, with areas selectively covered with a seed layer and an electroplated element.

DESCRIPTION

Wafer Level Packaging is a technique where multiple semiconductor devices are packaged in parallel. The devices are assembled on a wafer and the processes detailed below are conducted on the wafer and devices. The wafers are typically Silicon or Glass wafers. While the packaging process is drawn and described for a single die, the process occurs in parallel for all dies on the wafer. More ever, compound modules in which electrical connections between one or more semiconductor devices can be created using the described processes.

Patent Cooperation Treaty publication WO/2014/064541 to the same assignee discloses semiconductor devices that have pads on the bottom surface. The top surface was used for optical transmissive layers as required in light emitting diodes. In one example, the semiconductor device has at least one metal pad on top and bottom surface. A key aspect of this invention is the creation of heat conducting pathways in a wafer level package. The heat pathways conduct heat away from the semiconductor device. In contrast to Patent Cooperation Treaty publication WO/2014/064541 to the same assignee, the pathways extend from the device to the bottom and top surface of the package. The pathways are created in a wafer level package by following the steps outlined below. The resulting device is a wafer level packaged semiconductor device with enhanced heat dissipation properties.

The semiconductor device has a top face and bottom face and at least one metal pad located on top and bottom face. The semiconductor device has a top cover wafer affixed to top face of semiconductor device and a bottom cover wafer affixed to bottom face of semiconductor device; Whereas the semiconductor device has a metal pad located on top face and bottom face and the top cover wafer and bottom cover wafer have vias which extend from the external surface of said wafers to internal surface of said wafers, and an electroplated metal layer extends from the external face of said wafers through the via to the metal pad In one example the metal pad can be an electrical pad. In another example the metal pad can be a thermal pad. In some examples, the thermal pad would be larger than the metal pad to provide for efficient heat conduction from the semiconductor chip.

In one example the process flow for packaging the semiconductor device is; attaching multiple semiconductor devices to first wafer, applying an encapsulation layer on top of the devices and first wafer, attaching second wafer to encapsulation layer, creating holes in first and second wafers, whereas, the semiconductor device has metal pads and the holes provide a via from the external surface of the cover wafer to the metal pads, and a metal contact is created connecting the semiconductor device metal pad, through the via, to the external face of the wafer.

Figure 1B:
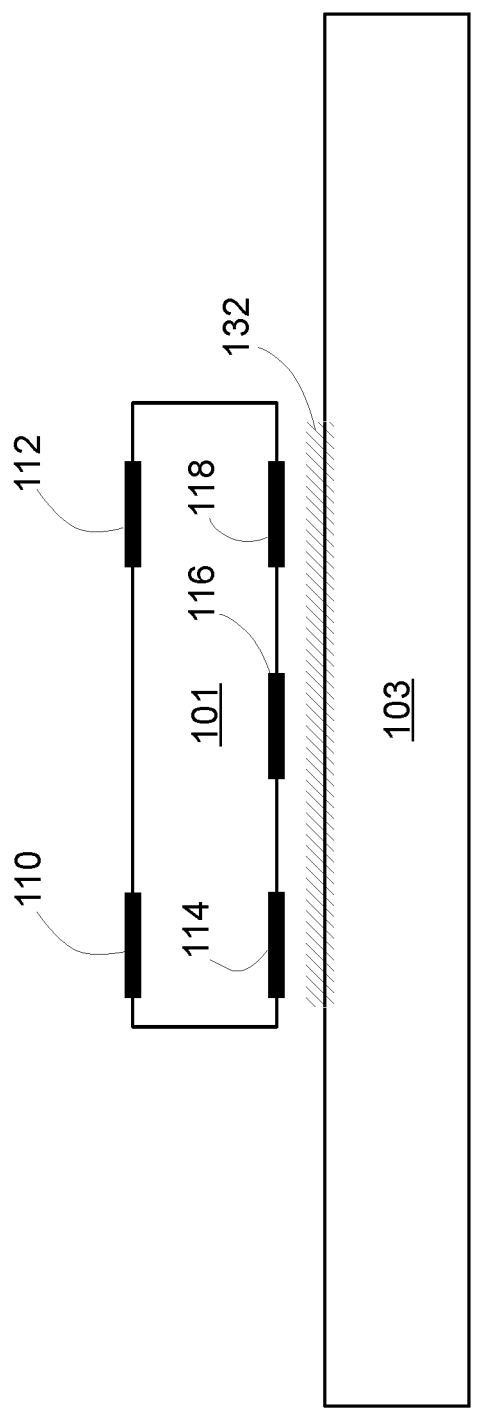
FIG. 1B shows an example of a semiconductor device attached to a portion of a wafer using an adhesive bonding technique.

FIG. 1A and FIG. 1B show an example of a single die (101) out of a plurality of dies assembled on a wafer. The dies (101) are assembled on a wafer (103) using either a metal bonding technique as shown in FIG. 1A or an adhesive bonding technique as shown in FIG. 1B. The number of assembled dies depends on the die dimensions, required distance between dies and wafer dimensions. For example, up to 10,000 dies of 1×1 mm size, with a 0.5 mm distance between dies, can be assembled on a 200 mm diameter wafer. FIG. 1A shows an example of a semiconductor device (101) attached to a wafer (103) using a metal bonding technique. The metal can be a eutectic combination such as Gold Tin (AuSn), Copper Tin (CuSn), Germanium Tin (GeTi) or a solder based process such as Tin (Sn). The metal can also be a combination of Aluminum Copper Tin and Gold. The metal pads (110, 112, 114, 118, 116, 120, 122, 124) are composed of layers of metals, for example Copper and Tin or Germanium and Tin, or Gold and Tin. The layers can be the same for all pads, or different for the electric (110, 112, 114, 118) and thermal pads (116). The layers may also be different for the metal pads (120,122,124) on the wafer (103). The metal layers can also include adhesion or seed layers such as Titanium (Ti), Chrome (Cr), Aluminum (Al), Nickel (Ni) or Platinum (Pt). In one example the metal pads (120,122,124) on the wafer (103) can be composed of Gold while the metal pads (110, 112, 114, 116, 118) on the semiconductor device (101) can be composed of Gold Tin. In another example the metal pads (120,122,124) on the wafer (103) can be composed of Aluminum, Copper and Tin layers, while the metal pads (110, 112, 114, 116, 118) on the semiconductor device can be composed of Gold Tin. In case of conducting wafers such as Silicon wafers, the wafer should have a top layer of an electrically isolating material. An example of a method to create this layer is by thermal oxidation of the Silicon wafer. As another example the layer can be deposited using Plasma Enhanced Chemical Vapor Deposition (PECVD) or Low Pressure Chemical Vapor Deposition (LPCVD). Examples of electrically isolating materials are SiN (SiN) or Silicon Oxide (SiO2) or Chemical deposition of Carbon Like Diamond (CLD). The pads on the die and on the wafer should have sufficient thickness for subsequent processing. In one example either the die or wafer pads should be at least 3 micron. The need for this will be explained later. FIG. 1B shows an example of a semiconductor device attached to a portion of a wafer using an adhesive bonding technique. In this example there is no need for an electrically isolating layer or metal pad on the wafer. The adhesive bond (132) provides the required electrical isolation. Examples of materials for the adhesive bond (132) include, Silicone based adhesives or Epoxy based adhesives. In one example of adhesive bonding the die pads are required to have sufficient thickness for further processing. For example the required thickness may be greater than 3 micron. In most of the examples, the dies can be attached to the wafer and the final bonding process is done after all dies are attached to the wafer. In one example all the assembled devices are the same device. In another example several types of devices are assembled. In this case the end product is composed of a package consisting of multiple semiconductor devices. In one example the wafer is one of Silicon, Glass, Quartz, Ceramic, Metal, Glass fiber and epoxy, polymer or another form of wafer.

Figure 2:
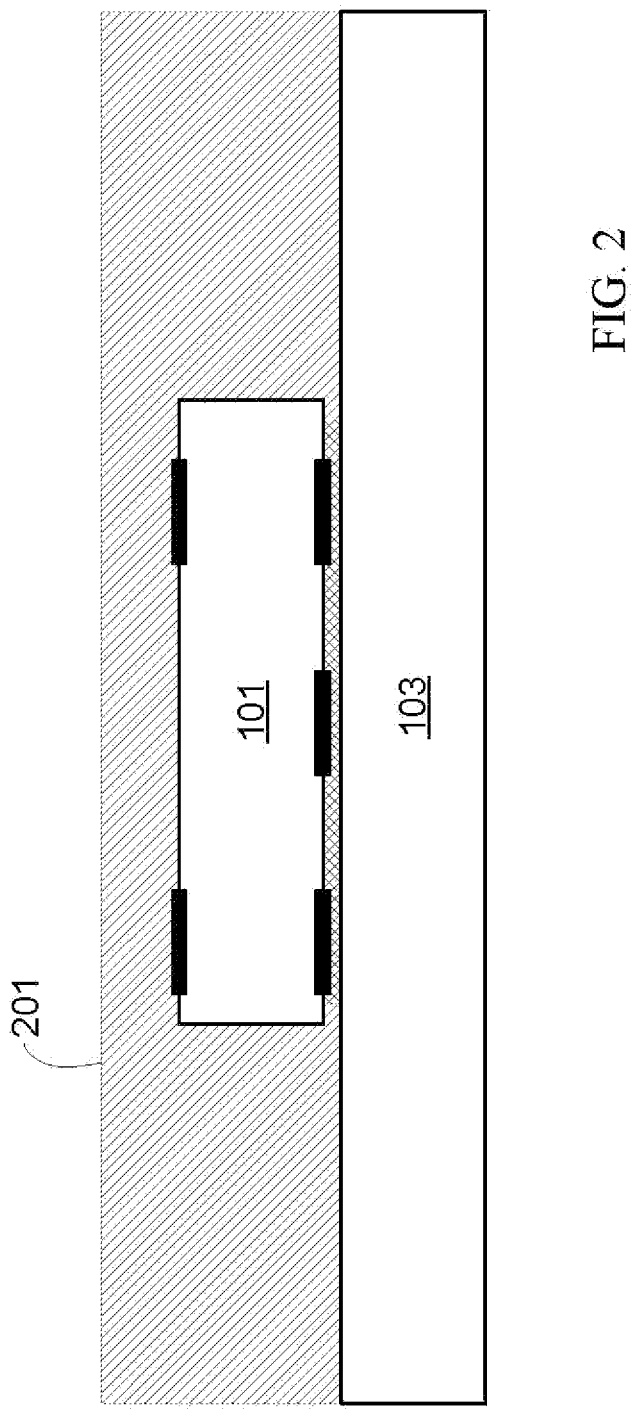
FIG. 2 shows an example of a portion of the wafer with a semiconductor device attached to it and an encapsulation layer.

FIG. 2 shows an example of a portion of the wafer with a semiconductor device attached to it and an encapsulation layer (201). After dies (101) are assembled on the wafer (103) the volume between the devices is filled with an encapsulation layer (201). Examples of the composition of the encapsulation material are, Silicone based material, Epoxy based material, or a polyamide based material. The top surface of the encapsulation layer (201) may be irregular, rough or have other topographies. Furthermore the encapsulation layer (201) can cover the dies at a height larger than required in the final structure. To obtain the desired height and surface profile the encapsulation layer (201) can be grinded or polished by suitable tools.

Figure 3:
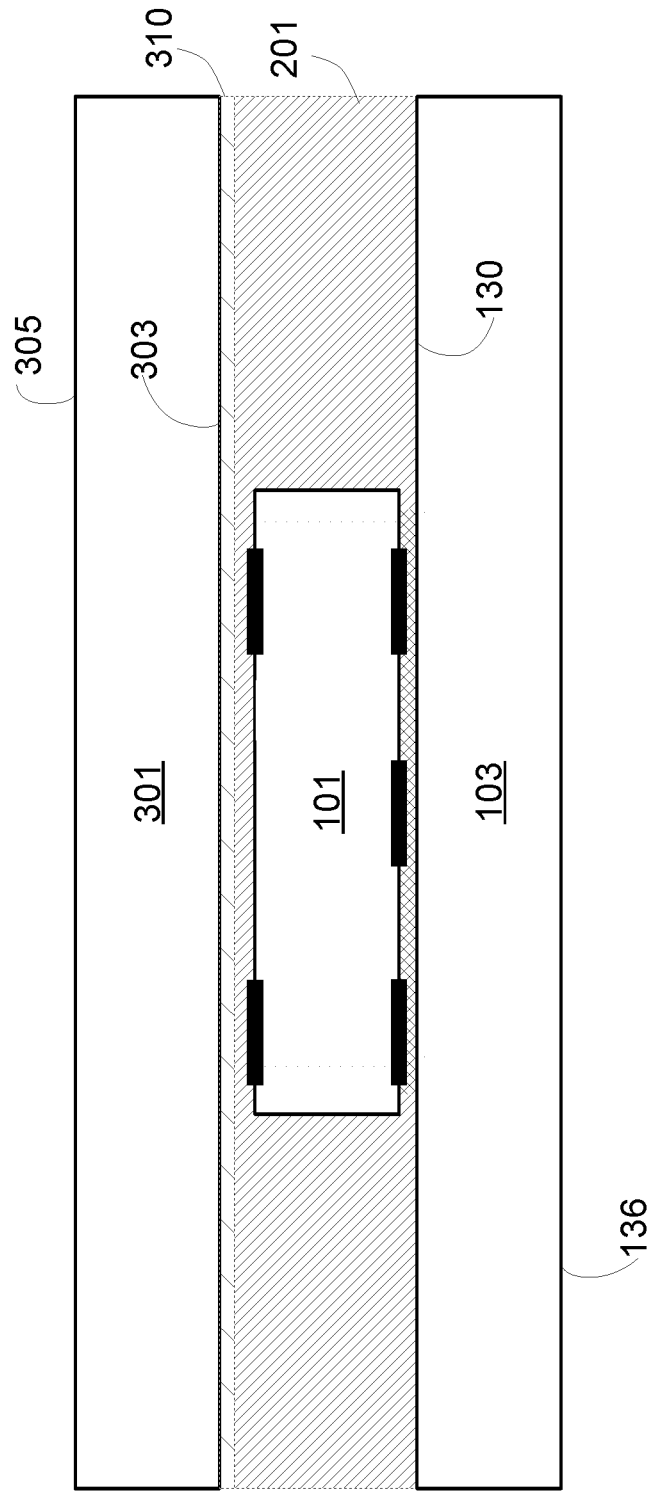
FIG. 3 shows an example of a portion of the wafer with a semiconductor device attached to it and an encapsulation layer which is polished and a top wafer attached with adhesive layer to the encapsulation layer.

The top surface of the encapsulation layer (201) is coated with a compatible adhesive layer (310). For example if the encapsulation layer (201) is a Silicone, than it is preferred but not mandated that the adhesive layer (310) would also be Silicone based. FIG. 3 shows an example of a portion of the wafer with semiconductor device attached to it and an encapsulation layer (201) which is polished and a top cover wafer (301) attached with the adhesive layer (310). The top cover wafer (301) can be a Silicon, Glass, Quartz, Ceramic, Metal, Glass fiber and epoxy, polymer or another form of wafer. In some cases there is no need for a top cover wafer (301) and the top surface is the encapsulation layer (201). In this case the description continues in the same manner but all references to the top cover wafer (301) refer to the top part of the encapsulation layer. As shown in FIG. 3 the resulting structure is a semiconductor device (101) located between a top cover wafer (301) and a bottom cover wafer (103).

Figure 4:
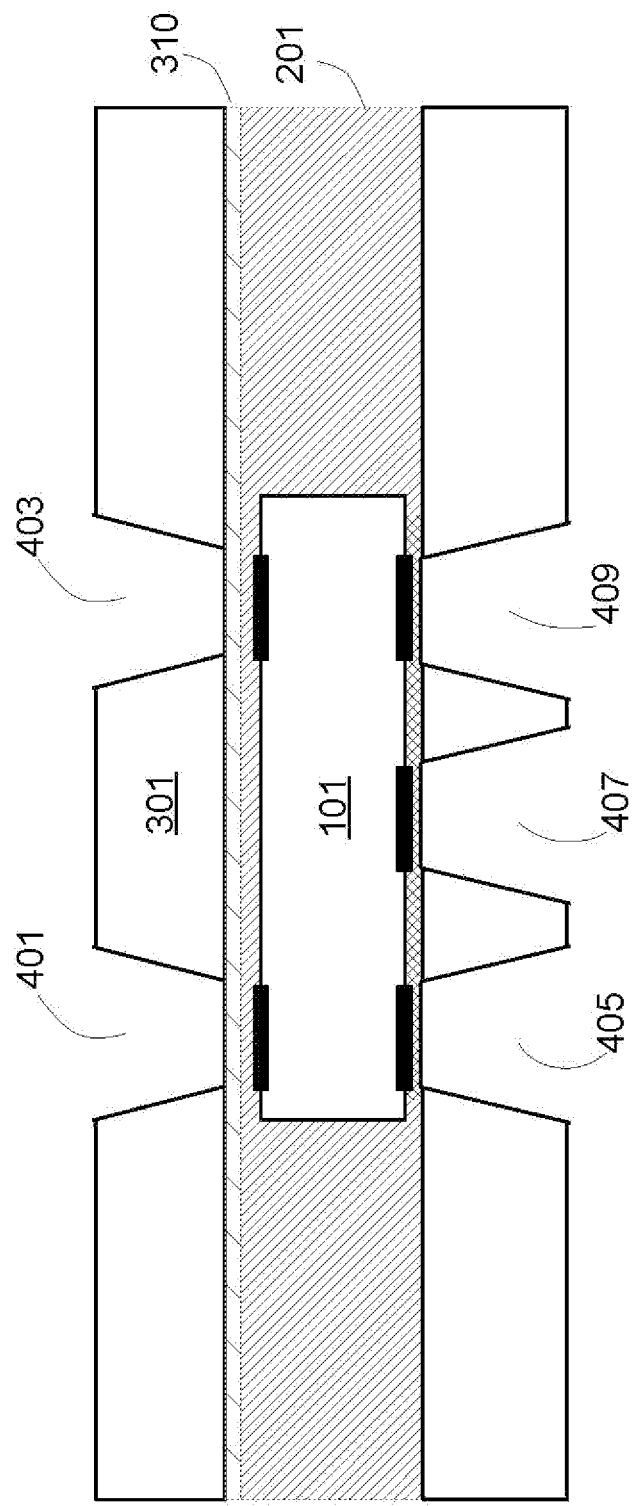
FIG. 4 shows an example of a portion of the bottom cover wafer and top cover wafer with semiconductor device attached to wafers and vias etched in the top and bottom wafer.

FIG. 4 Shows an example of a portion of the bottom cover wafer (103) and top cover wafer (301) with semiconductor device (101) attached to wafers and vias (401,403, 405, 407,409) etched in the top and bottom wafer. The vias (401,403, 405, 407, 409) are created by applying a photo imageable material such as a photo resist layer to external face (305) of top cover wafer (301) and external face (136) of bottom cover wafer (103). The application of the photo resist to each external face (103, 305) of the wafers (103, 301) can be done using a spin coating technique or a spray coating technique. After the photo resist is applied, it is defined by using a lithography system. After developing the resist, the resist will contain openings in areas, which are to be etched into vias (401,403, 405, 407, 409). In another example, the resist pattern can be defined by a printing method.

Figure 6:
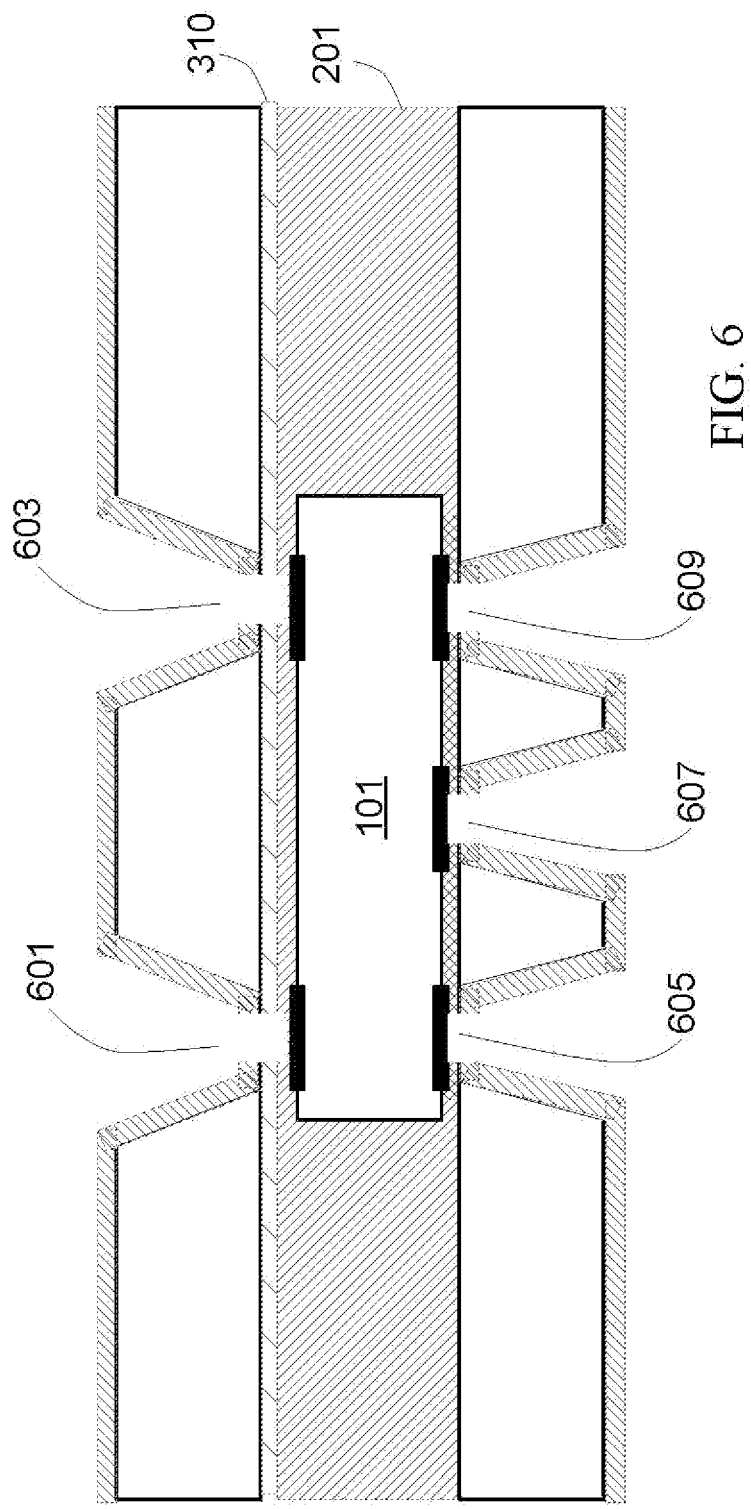
FIG. 6 shows an example of a portion of the wafers with semiconductor device attached to the wafers, where holes have been created in the electrical isolation layers of FIG. 5.

The exposed area of the wafers can be etched for example using a chemical method such as a wet etch or as another example using a chemical and physical process such as reactive ion etching (RIE) or deep reactive ion etching (DRIE). The angle of the hole is determined by the etching process, the etchant and the wafer material. If the etching is anisotropic than the result will typically have an angle of 450. In other cases the angle can range from 300 to 900. DRIE etching will typically result in angles greater than 700. The vias in the wafer should extend to the metal pads. In the example of FIG. 1A the metal pads (120, 122, 124) on the wafer (103) have an isolation layer between the pad and wafer. In one example, the vias (401,403, 405, 407, 409) should extend through this passivation layer and stop at the metal pad face. In the example of FIG. 1B there is an adhesive bond (132) between the die metal pads (110,112, 114) and the wafer (103). The vias (401,403, 405, 407, 409) should extend through the adhesive bond (132). Since the adhesive bond (132) is typically an organic material, a two-step etch process may be needed. In the first step the wafer material is etched using one etchant, and in the second step, the adhesive bond (132) is etched using a second etchant. The example of the top cover wafer (301) is similar to the example of FIG. 1B since the adhesive layer (310) and the encapsulating layer (201) are covering the die (101) and metal pads (110, 112). The adhesive layer (310) and encapsulation layer (201) can be etched in a similar manner as described for the example of FIG. 1B. FIG. 6 is an example where the adhesive layer (310) and encapsulation layer (201) are not etched at this stage and will be etched in subsequent stages.

In one example the wafers (103, 301) can be electrically isolating. In another example the wafers (103, 301) may be electrically conducting. In case they are electrically conducting than at least one cover wafer, either the top cover wafer (301) or bottom cover wafer (103) should have an electrically isolating layer. The layer can be deposited on at least the external face (305) or internal face (303) of the top cover wafer (301). The layer can also, or alternatively be deposited at least the external face (136) or internal face (132) of the bottom cover wafer (103).The electrically isolating layer can be composed of one or more of, SiO2, SiN, Epoxy, Silicone, polyamide.

Figure 5:
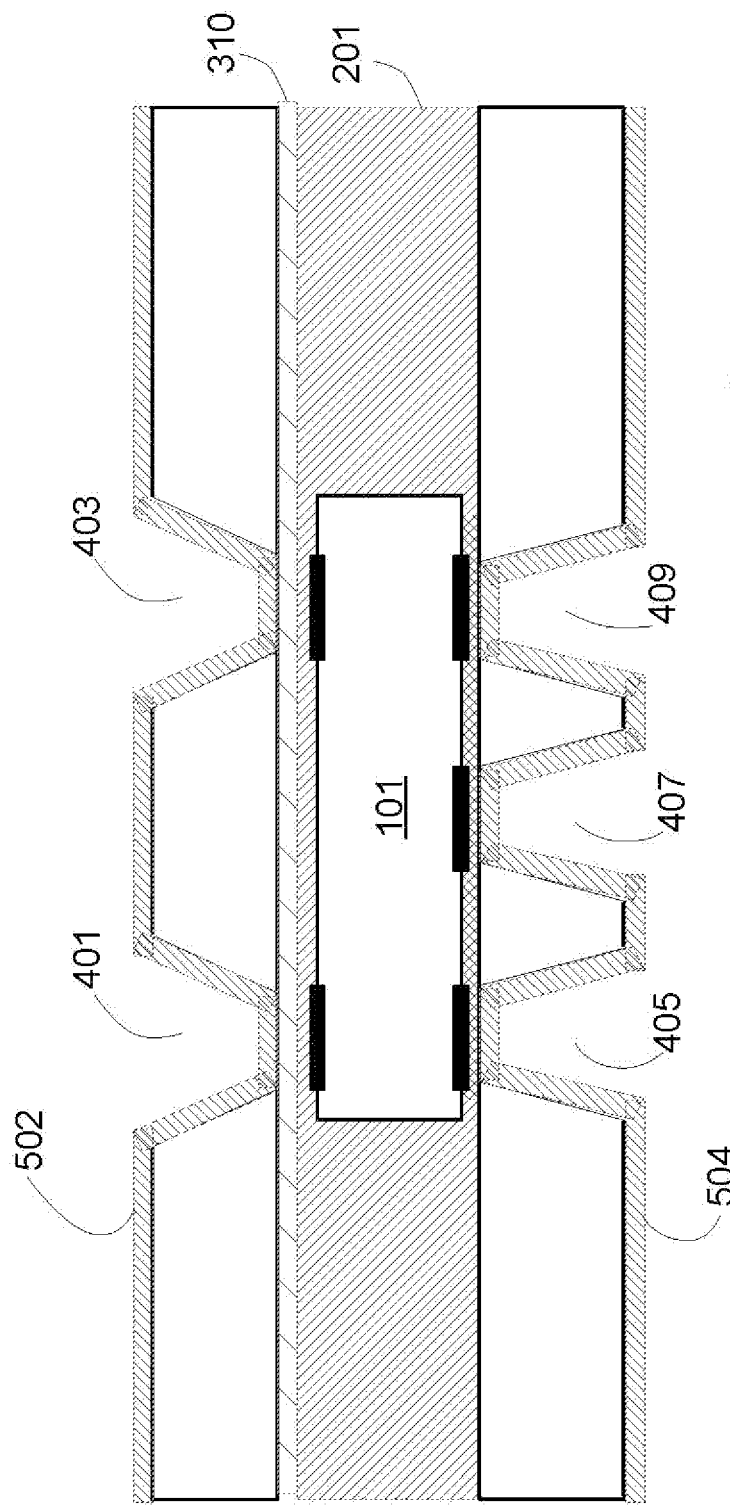
FIG. 5 shows an example of a portion of the top cover wafer and bottom cover wafer with a semiconductor device attached to it and a layer of an electrically isolating material applied to the external surfaces of the wafers and side wall of the vias.

FIG. 5 Shows an example of a portion of the top cover wafer (301) and bottom cover wafer (103) with a semiconductor device (101) attached to it and an electrically isolating layer (502, 504) applied to the external surfaces of the wafers (301, 103) and side wall of the via (401,403, 405, 407, 409). The electrically isolating layer can be a polymer, $SiO_2$, SiN, or combination of these materials or other examples of electrically isolating materials. The coating can be deposited using a spray coating tool for polymer material or PECVD for $SiO_2$ or SiN. High temperature processes cannot be used due to the encapsulation layer (201). Typically it is desired that the wafer level processes are done at temperatures below 400° C., or even below 300° C. The use of polymer materials for electrically isolation layer (502, 504) provides an additional benefit of enhancing the reliability of the packaged semiconductor devices. When a polymer is used for the electrically isolation layer (502, 504), it provides a compliancy, which buffers stress induced by thermal expansion. As a result the subsequently deposited metal layers providing electrical and thermal conduction are not subject to stress from thermal expansion of the wafers (103, 301).

FIG. 6 shows an example of a portion of the wafers with semiconductor device attached to the wafers, where holes (601, 603, 605, 607, and 609) have been created in the electrical isolation layers (502, 503) of FIG. 5. The holes can be created by a laser which is tuned to ablate or selectively remove the isolation layer. The laser can be designed to either be absorbed by the specific layer, or to have pulses with an energy which is suitable for ablation of the isolation layer but not of the metal pads. In this manner the metal pads serve as a stop layer for the laser. In another example, the isolation layer can be photo imageable such as a solder mask material. A mask or reticle is used to selectively illuminate the layer with a suitable UV light. The desired pattern can be either holes or rectangular holes in the case of a negative photo imaging material or a circle or rectangular in the case of a positive imaging material. The exposed parts of the layer are developed and removed leaving the holes (601, 603, 605, 607, and 609) in the isolation layer as depicted in FIG. 6. In another example the holes are defined by a photo resist material. In the case of a non-organic material such as SiN or SiO2, the photo resist is used directly over the isolating layers. In the case of an organic material, it may be required to include a metal layer below the photo resist to provide a hard mask functionality. After defining holes in the photo resist by using a masking illumination apparatus, the holes are transferred to the isolating layer using an etching process. The etch can be a wet chemistry based etch, e.g. HF for SiO2, or plasma etch. In the case of organic material an oxide plasma is needed. As this plasma will etch the photo resist, the metal hard mask provides the etching mask for the isolation layer. An important aspect of the creation of the holes (601, 603, 605, 607, and 609) in the isolation layer is to expose the metal pads. The metal pads provide the electrical and thermal connection to the semiconductor device. In the example described in FIG. 1A, the metal pads on the die (e.g. 114,116,118) are connected to metal pads on the wafer (e.g. 120, 122, 124). To expose the wafer metal pads (120, 122 and 124) through the wafer, the hole in the isolation layer needs to extend to the wafer metal pads (120, 122, 124 in FIG. 1A). In one example, the metal pad provides the required etch or ablation stop. In the example described in FIG. 1B the hole (601, 603, 605, 607 and 609) will extend to the die metal pads (114, 116, 118 in FIG. 1B) and expose them through the wafer. Previously in one example and as depicted in FIG. 6, the metal pads are not exposed and are covered by an adhesive layer (310) and encapsulation layer (201). These layers are now removed in the same process of etching or ablation as the isolation layer. In case the isolation layer is non organic a two-step etch process may be required. In the case of a two-step etch process, the first etchant will etch the non-organic isolation layer and the second etchant will etch the organic adhesive layer (310) and encapsulation layer (201). Hence in this example at least one via has an electrically isolating layer (502, 504 in FIG. 5) on the side walls of the via. The electrically isolating layer (502, 504 in FIG. 5) can be one of, SiO2, SiN, epoxy, Silicone, polyamide.

Figure 7A:
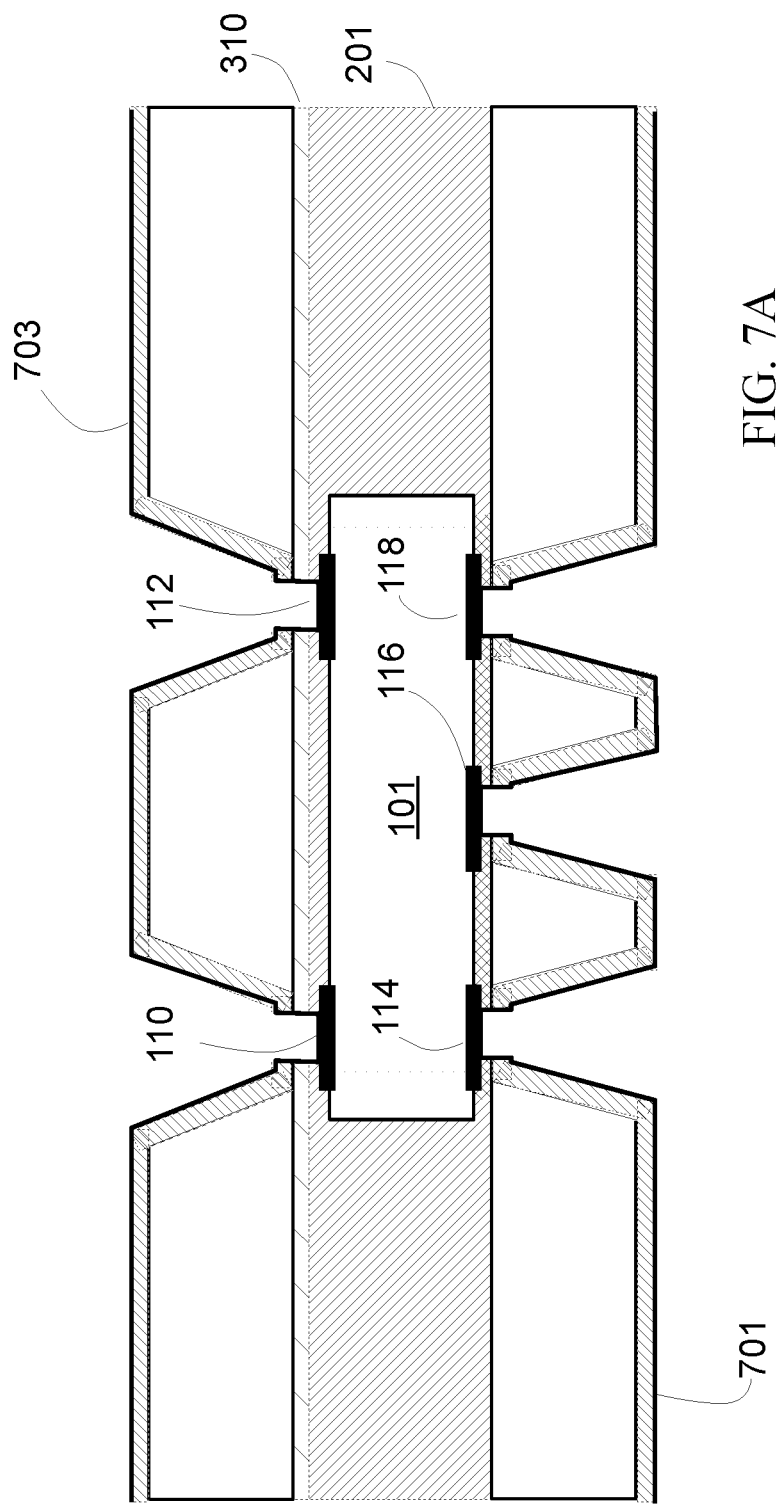
FIG. 7A shows an example of a portion of a top cover wafer and a bottom cover wafer with a semiconductor device attached to the wafers where the external face of the wafers are covered with a metal seed layer.

The electrical connection between the wafer external face and the exposed metal pads is obtained by a patterned metal layer extending from the wafer external face to the metal pad. An example of fabrication of a patterned metal layer is given in FIG. 7. FIG. 7A Shows an example of a portion of a top cover wafer (301) and a bottom cover wafer (103) with a semiconductor device (101) attached to the wafers (103, 301) where the external face (136, 305 in FIG. 5) of the wafers (103, 101) are covered with a metal seed layer (701, 703). The metal seed layer (701, 703) can be made of Al, Ni, Ti, Cr, Ag, Au, Cu, or similar metals or combinations of such metals. The metal seed layer (701, 703) is deposited using a sputtering technique or using an electro less deposition technique. The metal seed layer (701, 703) extends into the vias (401,403, 405, 407, 409 in FIG. 4) and into the holes (601, 603, 605, 607, 609 in FIG. 6) in the isolation layers (502, 504 in FIG. 5). The metal seed layer (701) makes an electrical contact with the metal pads (110, 112, 114, 118) or a thermal contact with metal pad (116). In one example, the metal and thermal pads are the same pad. In another example the thermal pad may have an intermediate electrical isolation layer.

The seed layer thickness is typically below 5 micron and even below 1 micron. Due to the small thickness of the seed layer, the seed layer typically does not provide the required electrical and thermal performance required. The seed layer is then plated with a second metal. To obtain the required thickness of the second metal layer, which is typically above 10 micron, an electroplating process is used. Prior to electroplating, the seed layer is patterned with a photo resist, an example of patterning the seed layer is shown in FIG. 7B.

Figure 7B:
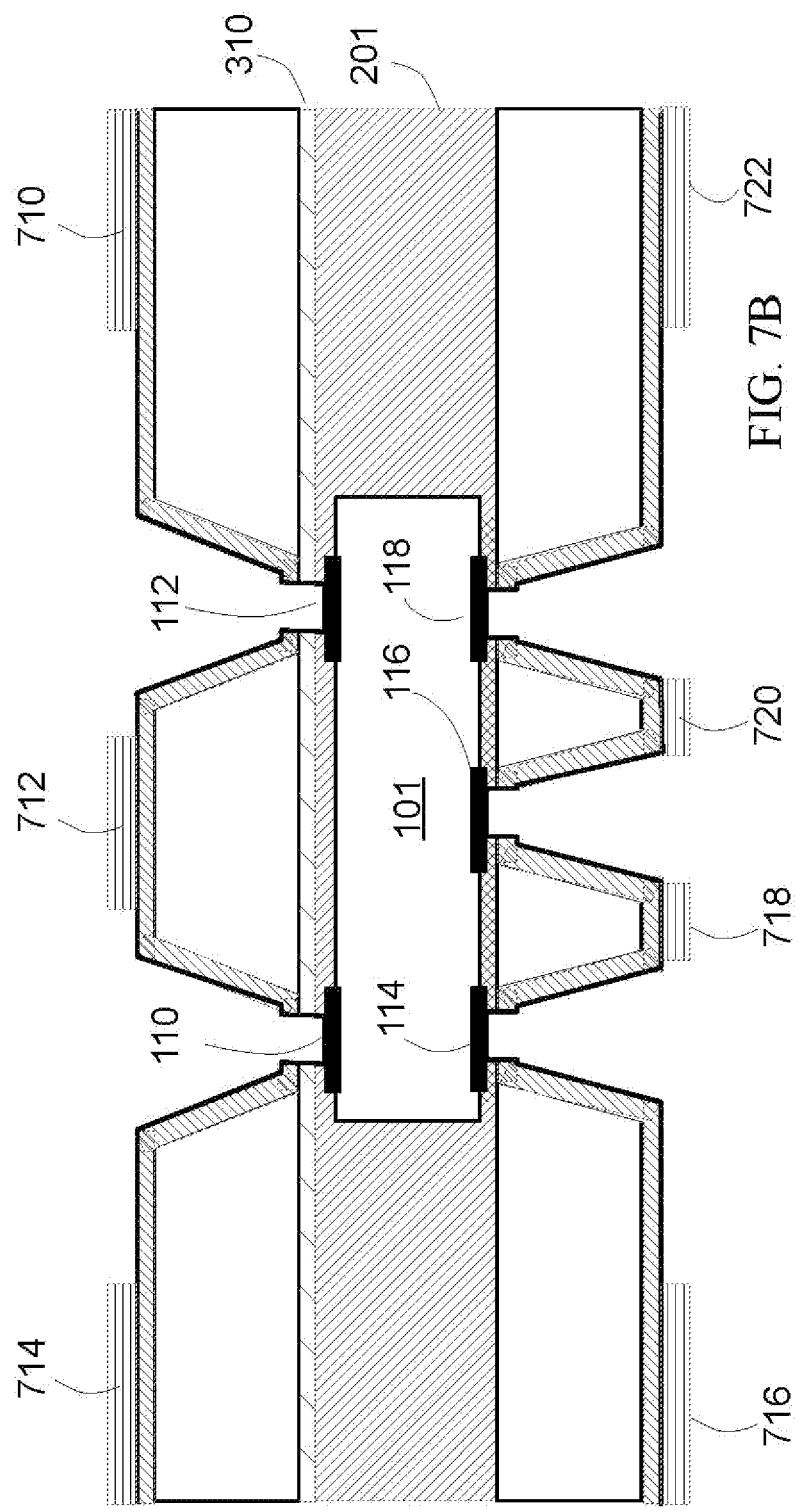
FIG. 7B shows an example of a portion of a top cover wafer and a bottom cover wafer with semiconductor device attached to the cover wafers, where the seed layer has patterned polymer areas on it.
Figure 7C:
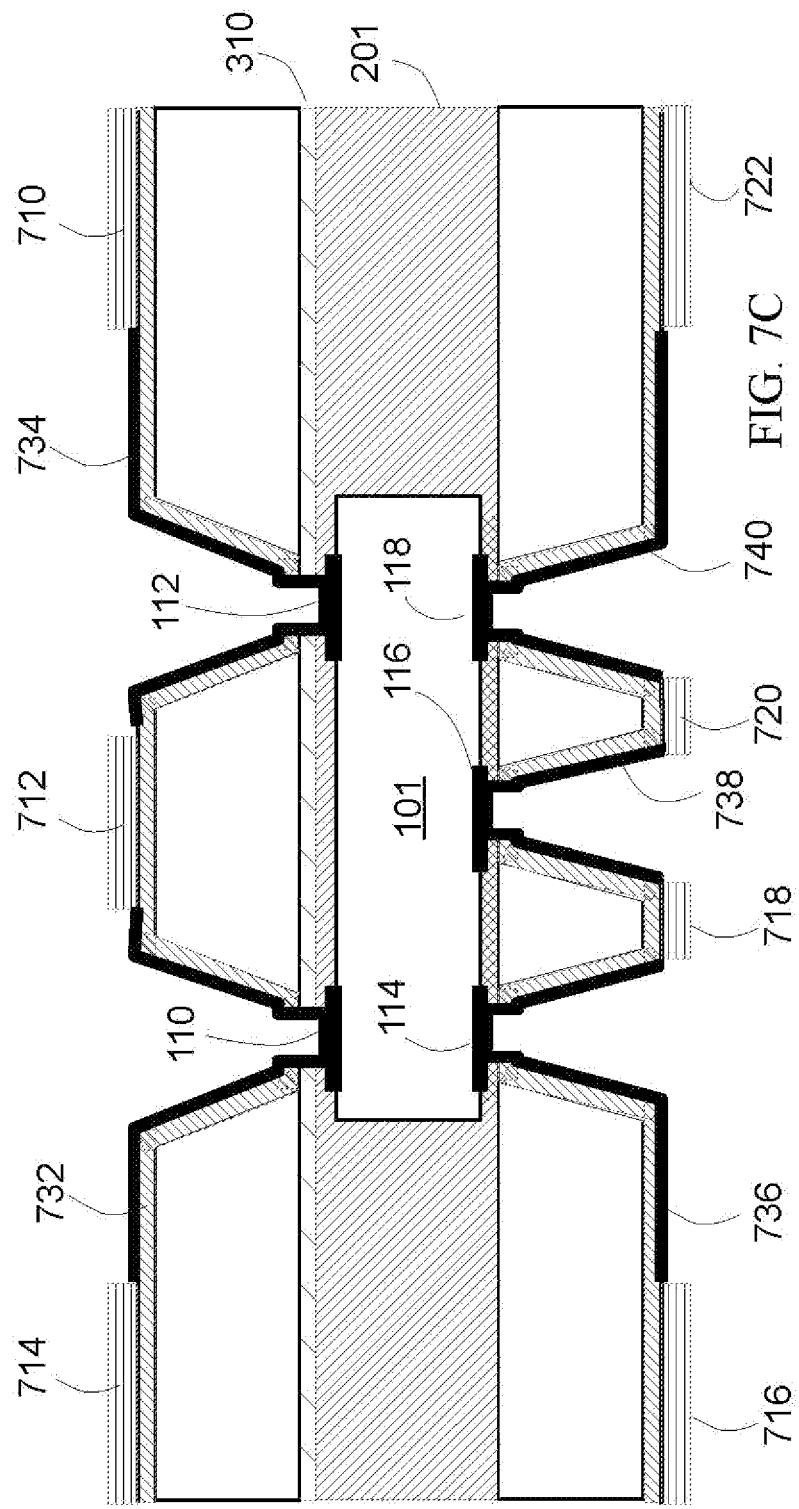
FIG. 7C shows an example of a portion of a top cover wafer and a bottom cover wafer with semiconductor device attached to the cover wafers, where the metal seed layer has been electroplated on the exposed areas of the seed layer.

FIG. 7B shows an example of a portion of a top cover wafer (301) and a bottom cover wafer (103) with semiconductor device (101) attached to the cover wafers, where the seed layer (701, 703 in FIG. 7) has patterned polymer areas (710, 712, 714, 716, 718, 720, 722) on it. The patterned polymer (710, 712, 714, 716, 718, 720, 722) can be a photo resist or other photo image able material. The wafer is then submerged in an electroplating batch. FIG. 7C shows an example of a portion of a top cover wafer (301 in FIG. 3) and a bottom cover wafer (103 in FIG. 3) with semiconductor device (101) attached to the cover wafers, where the metal seed layer (701, 703) has been electroplated on the exposed areas of the seed layer (732, 734, 736, 738, 740). The metal can be Cu, Ni, Ag, and similar such metals or combination of metals. After electroplating, the patterned polymer areas (710, 712, 714, 716, 718, 720, 722) are removed, and the exposed seed layer is etched using the electroplated metal (732, 734, 736, 738, 740) as a mask. The resulting structure is shown in FIG. 7D. FIG. 7D Shows an example of a portion of the cover wafers (103, 301 in FIG. 3) with a semiconductor device (101) attached to the wafers (103, 301, in FIG. 3) with areas selectively covered with a seed layer and an electroplated element (732, 734, 736, 738, 740).

The cover wafers (103, 301 in FIG. 3) can for example be electrically conducting such as from Silicon or a metal such as Copper. In this example, the electrically isolating layer (502, 503 in FIG. 5) prevents electrical short between the seed layer (732, 734, 736, 738, 740) and the cover wafer. The isolating layer coverage extends wherever there is an exposed element of the cover wafers (103, 310 in FIG. 3) including the vias (401,403, 405, 407, 409). In this manner, at least one via has an electrically isolating layer on the side wall of the via so that the seed metal layer and electroplated metal layer are electrically isolated from the cover wafer. The electrically isolating layer (502, 503 in FIG. 5) can be one of, SiO2, SiN, Epoxy, Silicone, polyamide.

In one example a semiconductor device with a top face and bottom face and at least one metal pad located on top and bottom face and; a top cover wafer affixed to top face of semiconductor device and; a bottom cover wafer affixed to bottom face of semiconductor device; whereas top and bottom cover wafers have vias extending from external face of each cover wafer to internal face of said cover wafer; and an electroplated metal layer extends from the external face of each cover wafer through the via to the metal pad. In another example at least one metal pad is an electrical pad. In another example at least one metal pad is a thermal pad. In another example at least one cover wafer is one of a Silicon, Glass, Quartz, Ceramic, Metal, Glass fiber and Epoxy, or polymer wafer. In another example at least one cover wafer is electrically isolating. In another example at least one cover wafer has an electrically isolating layer on at least one side of the wafer, said electrically isolating layer can be one of a group of electrically isolating layers consisting, SiO2, SiN, Epoxy, Silicone, or polyamide. In another example at least one via has an electrically isolating layer on the side wall of the via electrically isolating the electroplated metal layer from the cover wafer, said electrically isolating layer can be one of, SiO2, SiN, epoxy, Silicone, or polyamide. In another example the method of wafer level packaging of semiconductor devices comprising; attaching multiple semiconductor devices with metal pads to bottom wafer; applying an encapsulation layer on top of the devices and bottom wafer; attaching top wafer to encapsulation layer; making vias in top and bottom wafers from the external surface of the wafer to the metal pads; and electroplating a metal layer to connect the semiconductor device metal pad through the via to the external face of the wafer.

In another example the electroplated metal (732, 734, 736, 738, 740) may be used as an under bump metallization (UBM) for solder balls or solder paste. It is common practice in the semiconductor industry to attach packaged semiconductor devices to a printed circuit board (PCB) using solder balls or solder paste. Such packages are called BGA (Ball Grid Arrays). The solder balls may be electroplated on UBM, or using a ball dropping machine attached to the UBM. The solder paste can be screen printed on the electroplated metal (732, 734, 736, 738, 740).

Figure 8:
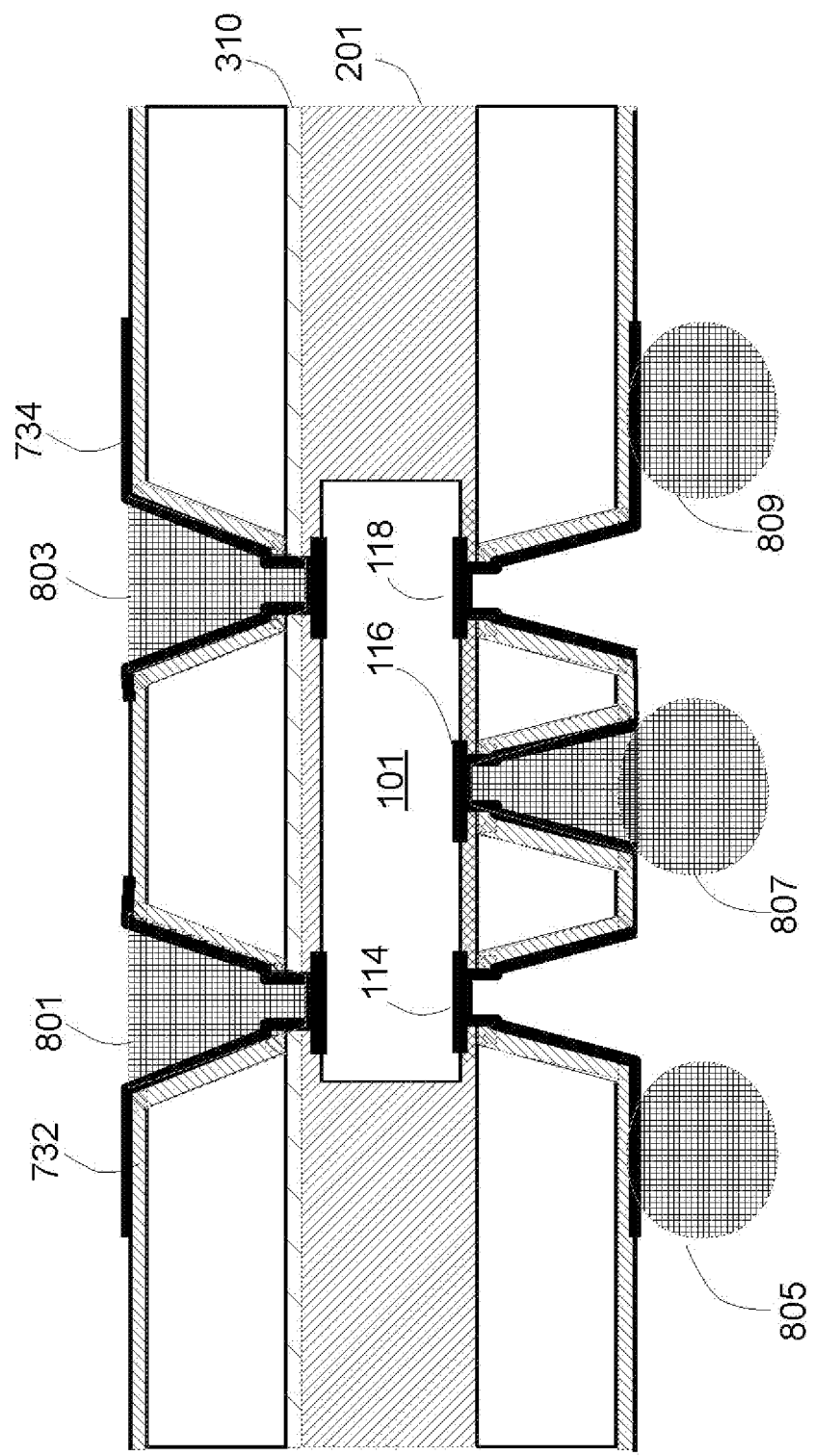
FIG. 8 shows an example of a portion of the cover wafers with a semiconductor device attached to the cover wafers where solder balls, solder paste, or other solder material has been attached to some of the electroplated material areas.

FIG. 8 shows an example of a portion of the cover wafers (103, 301 in FIG. 3) with a semiconductor device (101 in FIG. 3) attached to the cover wafers (103, 301 in FIG. 3), it where solder balls, solder paste, or other solder material has been attached to some of the electroplated material areas. In FIG. 8 Elements 801, 803, are electroformed or printed by solder paste material. In another example 801 or 803 can be other metal fillers. The materials can include Cu, Sn, and other metals including compositions of Cu or Sn. 805 and 809 are examples of solder balls which are attached to the UBM. In another example solder balls 805 and 809 can be formed by electroplating Sn material to the UBM and heating the material to reflow it. In another example the solder material is screen printed or printed using other methods to the UBM and reflowed in a heated environment. In another example the via cavity (807), is filled with a solder material, an electroformed material or other metal. In this example, after filling the cavity, the top part can be formed into a ball by reflow heating or a solder ball can be attached. The filled via and solder ball (807) is an example of a thermal via. To obtain high heat conduction and low heat resistance the via needs to be filled with a heat conducting metal such as Cu. In some examples Sn or compositions of Sn or Cu can be used.

What is claimed is:

1. A wafer level packaging of semiconductor devices comprising:

a semiconductor device with a top face and a bottom face and one or more metal pads with each metal pad located on either the top face or the bottom face and;

a top cover wafer affixed to the top face of the semiconductor device and;

a bottom cover wafer affixed to the bottom face of the semiconductor device;

wherein the top cover wafer and the bottom cover wafers have one or more vias extending from an external face of the respective cover wafer to an internal face of said cover wafer, wherein each of the one or more vias is associated with one of the one or more metal pads; and wherein an electroplated metal layer extends from the external face of each of the respective cover wafers through the via to the metal pad associated with the via.

2. The wafer level packaging of semiconductor devices of claim 1, wherein at least one metal pad is an electrical pad.

3. The wafer level packaging of semiconductor devices of claim 1, wherein at least one metal pad is a thermal pad.

4. The wafer level packaging of semiconductor devices of claim 1, wherein at least one of the cover wafers is one of a Silicon, Glass, Quartz, Ceramic, Metal, Glass fiber and Epoxy, polymer wafer.

5. The wafer level packaging of semiconductor devices of claim 1, wherein at least one cover wafer is electrically isolating.

6. The wafer level packaging of semiconductor devices of claim 1, wherein at least one cover wafer has an electrically isolating layer on at least one side of the wafer, said electrically isolating layer can be one of a group of electrically isolating layers consisting of: SiO2, SiN, Epoxy, Silicone and polyamide.

7. The wafer level packaging of semiconductor devices of claim 1, wherein at least one of the vias has an electrically isolating layer on a side wall of the via electrically isolating the electroplated metal layer from the cover wafer, said electrically isolating layer can be one of: SiO2, SiN, epoxy, Silicone and polyamide.

8. A wafer level packaging for semiconductor devices, wherein the semiconductor device includes a top face and a bottom face and one or more metal pads located on the top face or the bottom face, the wafer level packaging comprising:

a first wafer cover that includes an external face and an internal face, the first wafer cover is affixed to the top face of the semiconductor device by mating the internal face of the first wafer cover to the top face of the semiconductor device;

a second wafer cover that includes an external face and an internal face, the second wafer cover is affixed to the bottom face of the semiconductor device by mating the internal face of the second wafer cover to the bottom face of the semiconductor device;

the first wafer cover including one or more apertures that extend from the external face of the first wafer cover to the internal face of the first wafer cover, wherein at least one of the one or more apertures aligns with at least one of the one or more metal pads located on the top face of the semiconductor device;

the second wafer cover including one or more apertures that extend from the external face of the second wafer cover to the internal face of the second wafer cover, wherein at least one of the one or more apertures aligns with at least one of the one or more metal pads located on the bottom face of the semiconductor device; and wherein an electroplated metal layer extends from the external face of the first wafer cover wafer through the aperture to the at least one metal pad on the top surface of the semiconductor device and an electroplated metal layer extends from the external face of the second wafer cover wafer through the aperture to the at least one metal pad on the bottom surface of the semiconductor device.

* * * * *